United States Patent
Lius

(10) Patent No.: US 10,635,374 B2
(45) Date of Patent: Apr. 28, 2020

(54) ELECTRONIC DEVICE

(71) Applicant: InnoLux Corporation, Miao-Li County (TW)

(72) Inventor: Chandra Lius, Miao-Li County (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 16/115,048

(22) Filed: Aug. 28, 2018

(65) Prior Publication Data

US 2020/0073616 A1  Mar. 5, 2020

(51) Int. Cl.
*G09G 5/00* (2006.01)
*G06F 3/14* (2006.01)
*G02B 5/20* (2006.01)
*G02B 5/00* (2006.01)

(52) U.S. Cl.
CPC ........... *G06F 3/1446* (2013.01); *G02B 5/003* (2013.01); *G02B 5/20* (2013.01)

(58) Field of Classification Search
CPC ......... G06F 3/1446; G02B 5/003; G02B 5/20; H01L 27/1237
See application file for complete search history.

(56) References Cited

U.S. PATENT DOCUMENTS

| | | | | |
|---|---|---|---|---|
| 9,196,190 B2 * | 11/2015 | Liu | ...................... | G09G 3/2092 |
| 10,043,469 B2 * | 8/2018 | Al-Dahle | ................ | G06F 3/044 |
| 2005/0012722 A1 * | 1/2005 | Chon | .................. | G02F 1/13338 345/173 |
| 2005/0151059 A1 * | 7/2005 | Nakajima | .......... | G06K 15/1214 250/208.1 |
| 2005/0200293 A1 * | 9/2005 | Naugler, Jr. | ........ | G06F 3/03542 315/149 |
| 2006/0086896 A1 * | 4/2006 | Han | ...................... | G06F 3/0421 250/221 |
| 2008/0284925 A1 * | 11/2008 | Han | ...................... | G06F 3/0425 349/12 |
| 2010/0177372 A1 * | 7/2010 | Park | ..................... | G02B 13/008 359/263 |
| 2010/0302196 A1 * | 12/2010 | Han | ...................... | G06F 3/0425 345/173 |
| 2011/0037732 A1 * | 2/2011 | Takama | ................ | G06F 3/0412 345/175 |
| 2013/0285981 A1 * | 10/2013 | Xu | ......................... | G06F 3/0412 345/174 |
| 2015/0090909 A1 * | 4/2015 | Shih | ...................... | G01J 1/0266 250/578.1 |
| 2015/0185907 A1 * | 7/2015 | Yashiro | ................... | G06F 3/044 345/174 |
| 2017/0092668 A1 * | 3/2017 | Kim | ..................... | H01L 51/5268 |
| 2017/0345860 A1 * | 11/2017 | Nagaya | ................... | G02B 5/22 |
| 2017/0364763 A1 | 12/2017 | Jin et al. | | |

* cited by examiner

*Primary Examiner* — Joe H Cheng
(74) *Attorney, Agent, or Firm* — Muncy, Geissler, Olds & Lowe, P.C.

(57) ABSTRACT

An electronic device is disclosed, which includes: a display module having a display side and including a plurality of display units; and an optical sensing module disposed opposite to the display side and including a plurality of optical sensing units, wherein a density of the plurality of optical sensing units is greater than a density of the plurality of display units.

19 Claims, 10 Drawing Sheets

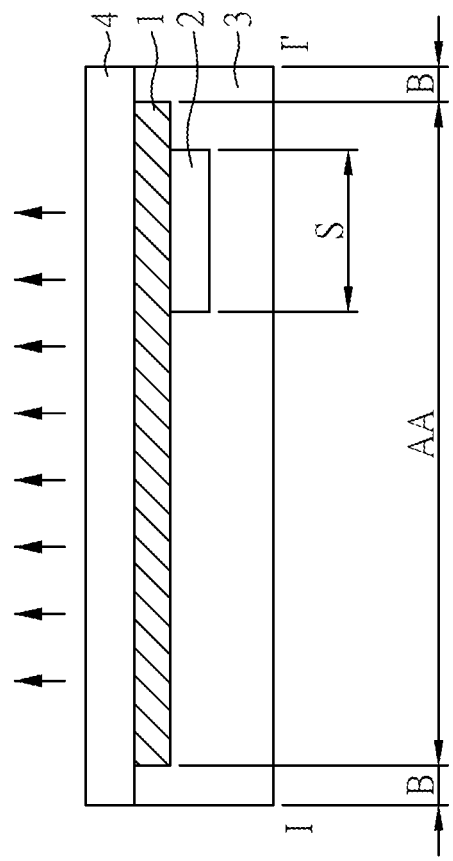
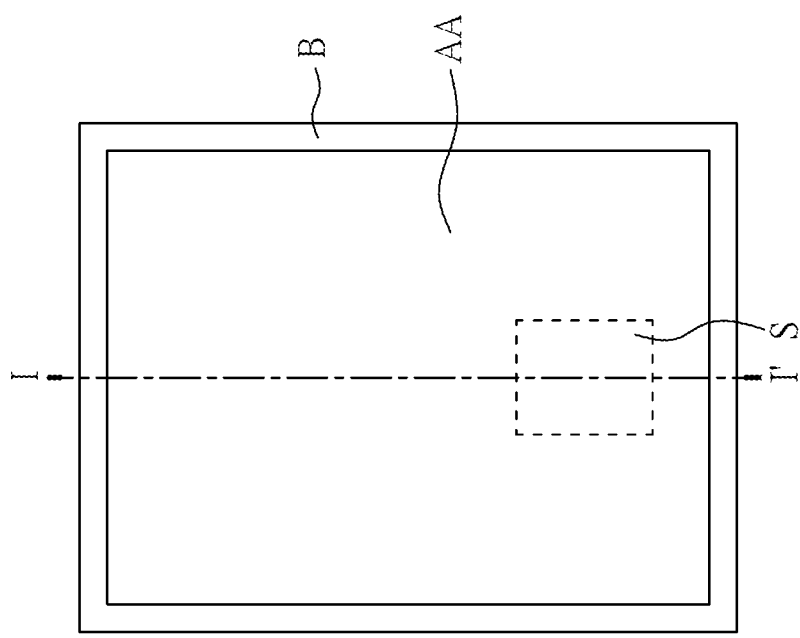
FIG. 1B
FIG. 1A

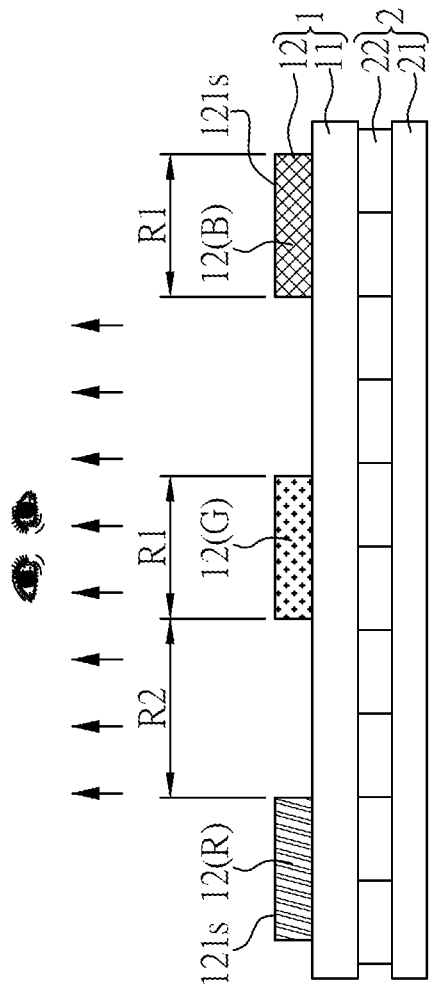
FIG. 2
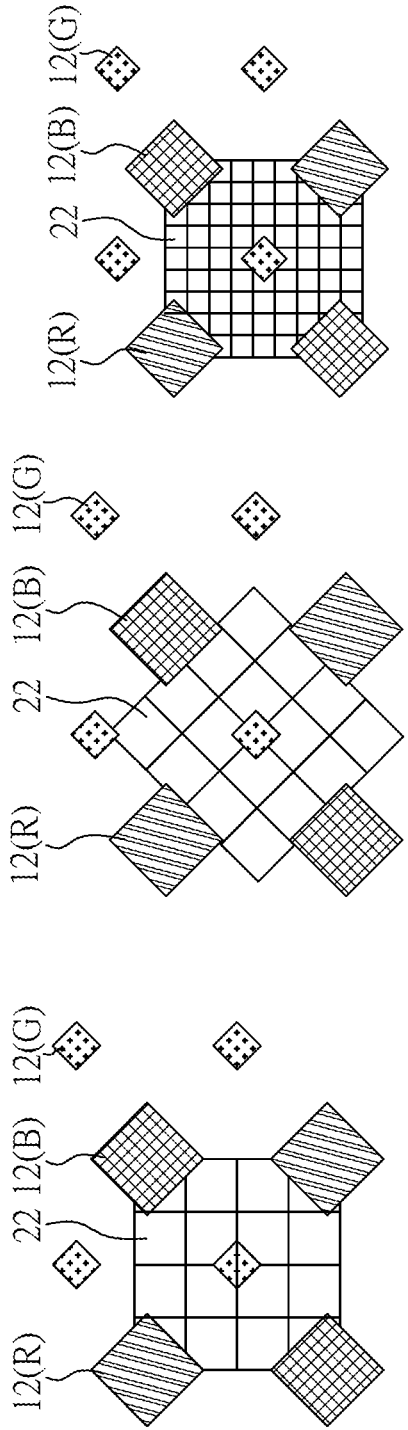
FIG. 3A
FIG. 3B
FIG. 3C

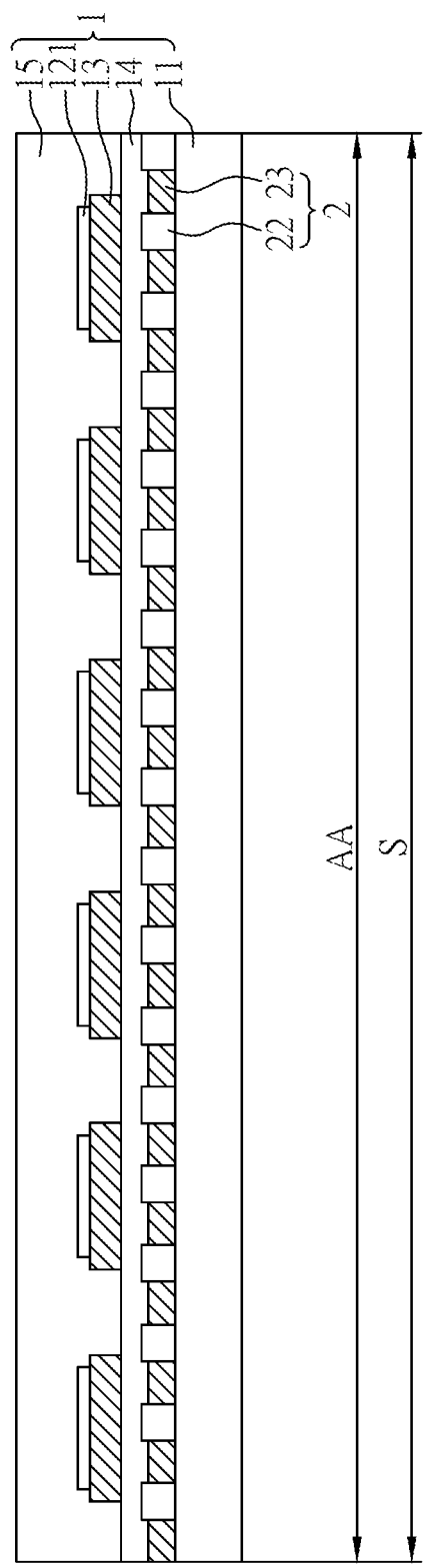
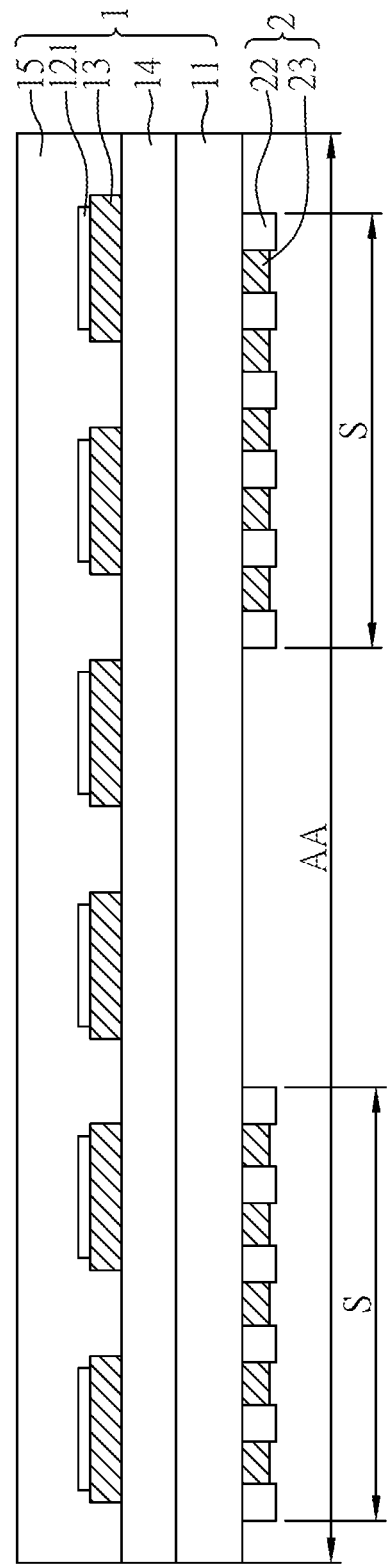

ELECTRONIC DEVICE

BACKGROUND

1. Field

The present disclosure relates to an electronic device. More particularly, the present disclosure relates to an electronic device with optical sensing units.

2. Description of Related Art

With the continuous advancement of technologies related to electronic devices, all the electronic devices are now developed toward compactness, thinness, and lightness. For example, thin display devices are the mainstream display devices on the market.

Nowadays, the electronic devices, for example, the display devices are required to have not only the display function but also other functions such as touch sensing or identification functions. In addition, for the display devices to have higher display-to-body ratio, sensors of the display devices have to be disposed into display regions of the display devices.

However, the light emitting units and the pixel circuitry of the display devices have already occupied most of the display region, leaving little transparent area for the light to reach the sensors in the display regions. Therefore, it is desirable to provide a novel electronic device to improve the sensitivity of the sensors disposed in the display regions.

SUMMARY

The present disclosure provides an electronic device, which comprises: a display module having a display side and comprising a plurality of display units; and an optical sensing module disposed opposite to the display side and comprising a plurality of optical sensing units, wherein a density of the plurality of optical sensing units is greater than a density of the plurality of display units.

Other novel features of the disclosure will become more apparent from the following detailed description when taken in conjunction with the accompanying drawings.

BRIEF DESCRIPTION OF THE DRAWINGS

FIG 1A is a top view of an electronic device of the present disclosure.

FIG. 1B is a cross-sectional view of an electronic device of the present disclosure.

FIG. 2 is a cross-sectional view showing a sensing region of an electronic device according to one embodiment of the present disclosure.

FIG. 3A to FIG. 3D are top views showing a part of a sensing region of an electronic device according to different embodiments of the present disclosure.

FIG. 10 is a cross sectional view showing a part of an electronic device according to Embodiment 7 of the present disclosure.

FIG. 11 is a cross sectional view showing a part of an electronic device according to Embodiment 8 of the present disclosure.

DETAILED DESCRIPTION OF EMBODIMENT

Figure 3D:
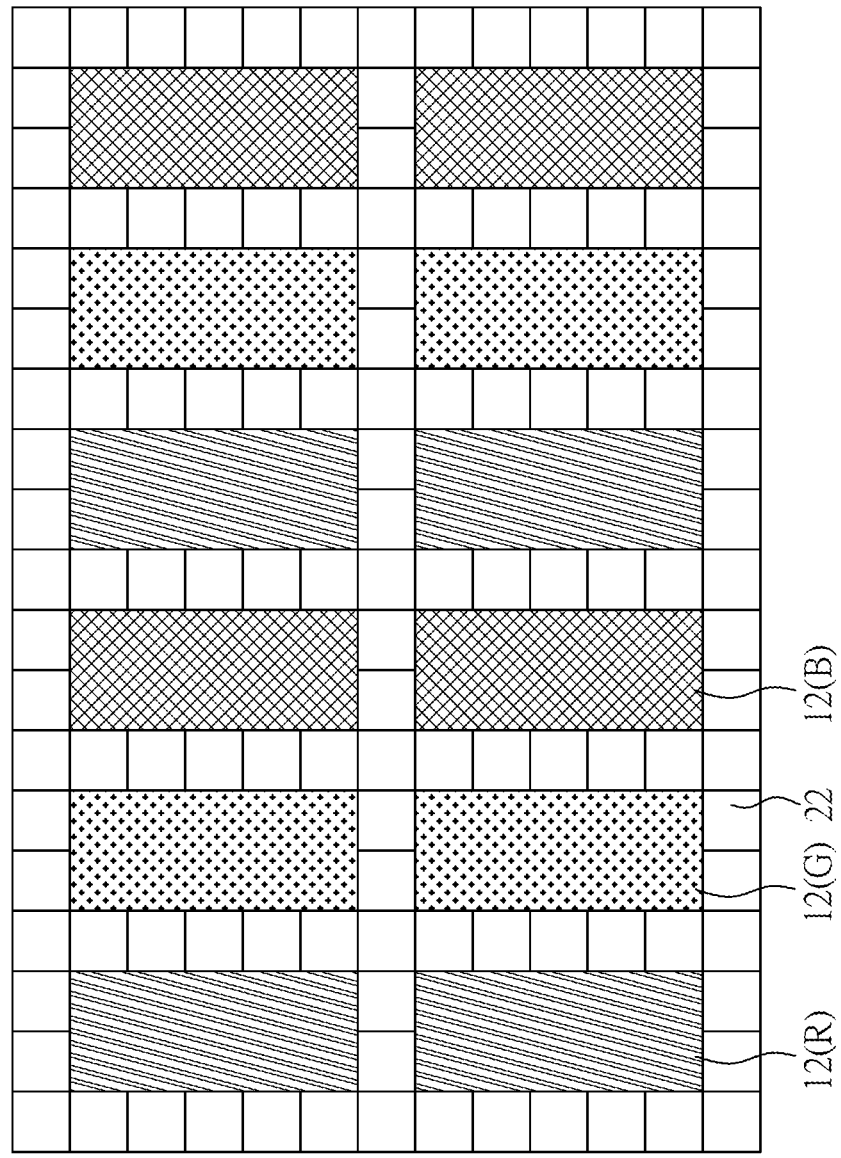

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

In addition, the features in different embodiments of the present disclosure can be mixed to form another embodiment.

In the present disclosure, "a density of an element" refers to a number of the smallest unit of the element (such as display units, optical sensing units, first openings and second openings) in a pre-determined region (such as a part of a sensing region or a whole sensing region).

Moreover, in the present disclosure, "a top view" refers to a view observing the electronic device from a display side of the electronic device.

FIG 1A is a top view of an electronic device of the present disclosure, and FIG. 1B is a cross-sectional view according to the line I-I' indicated in FIG. 1A.

As shown in FIG 1A and FIG. 1B, the present disclosure provides an electronic device, which can be a display device. The electronic device of the present disclosure comprises: a display region AA; and a non-display region B adjacent to the display region AA, wherein the display region AA comprises a sensing region S. Thus, in the aspect shown in FIG 1A and FIG. 1B, the sensing region S is less than the display region AA. In another aspect of the present disclosure, the sensing region S is greater than the display region AA. In further another aspect of the present disclosure, the sensing region S is equal to the display region AA.

The electronic device of the present disclosure further comprises: a display module 1 disposed in the display region AA; an optical sensing module 2 disposed under the display module 1 and in the sensing region S; and a housing 3, wherein the display module 1 and the optical sensing module 2 are disposed in the housing 3.

In the present embodiment, the optical sensing module 2 is disposed in the display region AA of the electronic device, and thus an electronic device with a high display-to-body ratio can be obtained. FIG. 2 is a cross-sectional view showing a sensing region of an electronic device according to one embodiment of the present disclosure. The electronic device comprises: a display module 1 having a display side (which is indicated by solid arrows) and comprising a plurality of display units 12; and an optical sensing module 2 disposed opposite to the display side and comprising a plurality of optical sensing units 22. The display module 1 further comprises a substrate 11, and the display units 12 are disposed on the substrate 11. Herein, emitting surfaces 121s of the display units 12 that light emits therefrom is the display side. The optical sensing module 2 further comprises a sensor substrate 21, and the optical sensing units 22 are disposed on the sensor substrate 21.

Herein, the substrate 11 and the sensor substrate 21 can respectively be a quartz substrate, a glass substrate, a wafer, a sapphire substrate, or etc. Also, the substrate 11 and the sensor substrate 21 can respectively be a flexible substrate or a film, and the material of which can comprise polycarbonate (PC), polyimide (PI), polypropylene (PP), polyethylene terephthalate (PET), or other plastic or polymer material.

In addition, the display units 12 can be organic light-emitting diodes (OLEDs) or inorganic light-emitting diodes (LEDs), such as normal light emitting diodes (normal LEDs), mini light-emitting diodes (mini-LEDs), micro light-emitting diodes (micro-LEDs), or quantum-dot light-emitting diodes (QLEDs). It could be understood that the chip size of the normal LED can be 300 μm to 10 mm, the chip size of the mini-LED can be 100 μm to 300 μm, and the chip size of the micro-LED can be 1 μm to 100 μm. But, the present disclosure is not limited thereto.

Furthermore, the optical sensing units 22 can be fingerprint sensors, iris sensors, retina sensors, facial sensors, vein sensors, voice sensors, motion sensors, gesture sensors, gaze tracking sensors, proximity sensors, DNA sensors or other suitable sensors, but the present disclosure is not limited thereto.

In the present embodiment, the display module 1 has circuits, connecting wires, transistors and/or other elements not shown in the figure. The display module 1 has a light shielding region R1 and a light passing region R2. The light passing region R2 is a region with 80% or more transmittance at the wavelength range that the optical sensing units 22 can detect. Herein, at least one of the optical sensing units 22 is disposed in the light passing region R2. The light shielding region R1 is a region with less than 80% transmittance at the wavelength range that the optical sensing units 22 can detect. Herein, the display units 12 are disposed in the light shielding region R1. Thus, light can only reach the optical sensing units 22 beneath the display module 1 through the light passing region R2.

FIG. 3A to FIG. 3D are top views showing a part of a sensing region of an electronic device according to different embodiments of the present disclosure. In FIG. 2 to FIG. 3D, the display units 12 comprises a red display unit 12(R), a green display unit 12(G) and a blue display unit 12(B). However, the present disclosure is not limited thereto. For example, in another embodiment of the present disclosure, the display units 12 may further comprise a yellow display unit or a white display unit.

As shown in FIG. 2 to FIG. 3D, in the sensing region, a density of the optical sensing units 22 is greater than a density of the display units 12, so the number of the optical sensing units 22 is greater than the number of the display units 12. Thus, some of the optical sensing units 22 can be exposed from the display units 12, and in other words, some of the optical sensing units 22 correspond to the light passing region R2 of the display module 1. Hence, light (for example, photo signals input by a user) can pass and reach the optical sensing units 22 exposed from the display units 12. Herein, "the density of the optical sensing units 22" and "the density of the display units 12" respectively refers to the number of the optical sensing units 22 and the number of the display units 12 in a predetermined region (for example, 1 mm×1 mm)

In addition, the size of the optical sensing units 22 is less than the size of some of the display units 12. For example, in FIG. 3A and FIG. 3B, the size of the optical sensing units 22 is less than the size of the red display units 12(R) and the blue display units 12(B). In FIG. 3C and FIG. 3D, the size of the optical sensing units 22 is less than the size of the red display units 12(R), the green display units (G) and the blue display units 12(B). But, the present disclosure is not limited thereto.

Furthermore, as shown in FIG. 2 to FIG. 3C, some of the optical sensing units 22 can be totally or partially covered by the red display units 12(R), the green display units (G) and the blue display units 12(B). As shown in FIG. 3D, the optical sensing units 22 are disposed around the red display units 12(R), the green display units (G) and the blue display units 12(B) and are not covered by the red display units 12(R), the green display units (G) or the blue display units 12(B). However, the present disclosure is not limited thereto.

Hereinafter, the following Embodiments 1 to 10 provides some aspects of the electronic devices of the present disclosure. The general structures of the electronic devices of the following Embodiments 1 to 10 are similar to those illustrated above, and are not repeated again.

Embodiment 1

Figure 4:
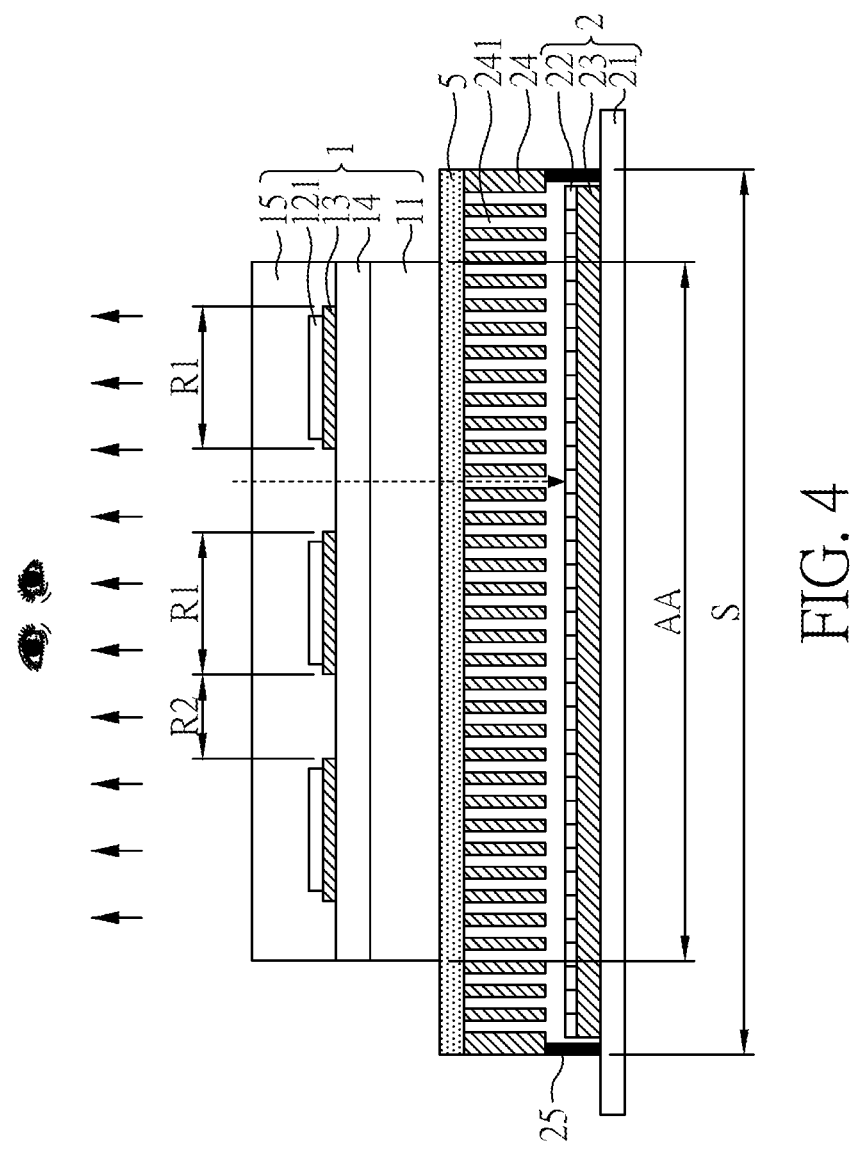
FIG. 4 is a cross sectional view showing a part of an electronic device according to Embodiment 1 of the present disclosure.

FIG. 4 is a cross sectional view showing a part of an electronic device according to the present embodiment.

The electronic device of the present embodiment comprises: a display module 1 having a display side (which is indicated by solid arrows) and comprising display units 121;

and an optical sensing module 2 disposed opposite to the display side and comprising optical sensing units 22, wherein a density of the optical sensing units 22 is greater than a density of the display units 121. In addition, one of the display units 121 is overlapped with at least one of the optical sensing units 22 in a top view.

More specifically, the display module 1 comprises: a substrate 11; an intermediate layer 14 disposed on the substrate 11; a driving layer 13 disposed on the intermediate layer 14; and display units 121 disposed on the driving layer 13. Herein, the driving layer 13 can comprise circuits, connecting wires, transistors or other components for driving the display units 121. The intermediate layer 14 may comprise a buffer layer, an insulating layer, a metal layer, a planarization layer or other layers for the display device. However, the present disclosure is not limited thereto.

In addition, the display module 1 may further comprise an encapsulating layer 15 disposed on the display units 121, but it is not limited thereto.

The optical sensing module 2 comprises: a sensor substrate 21; a sensor driving layer 23 disposed on the sensor substrate 21; and optical sensing units 22 disposed on the sensor driving layer 23. Herein, the sensor driving layer 23 may comprise circuits, connecting wires or transistors for driving optical sensing units 22. In addition, the sensing region S is greater than the display region AA.

In the present embodiment, the display module 1 has a light shielding region R1 and a light passing region R2, and the display units 121 are disposed in the light shielding region R1. Herein, the light shielding region R1 is the region occupied by the driving layer 13 and the display units 121. Because the driving layer 13 and the display units 121 are disposed in the light shielding region R1, light (for example, external photo signals) cannot penetrate through the driving layer 13 and the display units 121 in the light shielding region R1. On the other hand, the light passing region R2 are not occupied by the driving layer 13 and the display units 121, the light passing region R2 has a certain level of the light transmittance, so the light (for example, photo signals input by a user) can pass through the light passing region R2 to reach at least one of the optical sensing units 22, as indicated by the dashed line with the arrow.

In the present embodiment, the electronic device may further comprise: a first optical modulating layer 24 disposed between the display module 1 and the optical sensing module 2, wherein the first optical modulating layer 24 comprises a plurality of first openings 241, and a density of the first openings 241 is greater than the density of the display units 121. The first optical modulating layer 24 can be used to guide the light (for example, photo signals input by a user) to reach the optical sensing units 22, or can be used to filter undesirable noise. In addition, one of the display units 121 is overlapped with at least one of the first openings 241 in a top view.

Herein, at least one of the first openings 241 is disposed in the light passing region R2. In addition, one of the first openings 241 and one of the optical sensing units 22 are overlapped in a top view. For example, the first openings 241 are aligned with the optical sensing units 22. The size of the first openings 241 is less than the size of the optical sensing units 22, and at least one of projection of the first openings 241 is respectively fallen within one of the optical sensing units 22. However, the present disclosure is not limited thereto, as long as the light (for example, photo signals input by a user) passing through the light passing region R2 can further pass through at least one of the first openings 241 to reach at least one of the optical sensing units 22, as indicated by the dashed line with an arrow.

In addition, a first adhesive element 25 may be disposed between the first optical modulating layer 24 and the optical sensing module 2. More specifically, the optical sensing module 2 comprise the sensor substrate 21, and the first adhesive element 25 may be disposed on the sensor substrate 21 to adhere the first optical modulating layer 24 to the sensor substrate 21. The first adhesive element 25 may comprise an adhesive or a sealant, but the present disclosure is not limited thereto.

Furthermore, the first optical modulating layer 24 can be mounted under the substrate 11 via a second adhesive element 5. In other words, the second adhesive element 5 is disposed between the substrate 11 of the display module 1 and the first optical modulating layer 24. Because the light (for example, photo signals input by a user) will pass through the second adhesive element 5, the second adhesive element 5 has to have a certain degree of transparency. For example, the second adhesive element 5 may be an optical clear adhesive layer. In other embodiments, the second adhesive element 5 may be patterned to have openings, and the openings are corresponding to the light passing region R2. If the second adhesive element 5 is patterned, the second adhesive element 5 could be optical clear adhesive layer or opaque adhesive layer; but it is not limited thereto.

Embodiment 2

Figure 5:
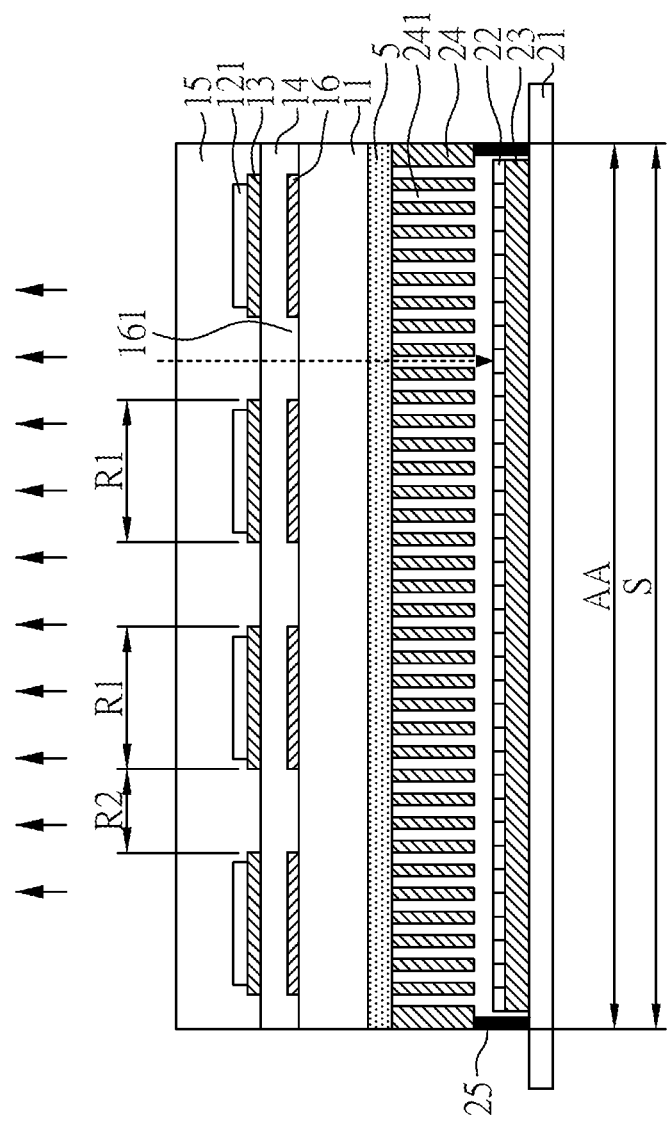
FIG. 5 is a cross sectional view showing a part of an electronic device according to Embodiment 2 of the present disclosure.

FIG. 5 is a cross sectional view showing a part of an electronic device according to the present embodiment.

The electronic device of the present embodiment is similar to that of Embodiment 1, except that the sensing region S is equal to the display region AA and the electronic device of the present embodiment further comprises a second optical modulating layer.

More specifically, as shown in FIG. 5, the electronic device of the present embodiment further comprises: a second optical modulating layer 16 disposed between the display units 121 and the first optical modulating layer 24, wherein the second optical modulating layer 16 comprises a plurality of second openings 161, and a density of the second openings 161 is less than the density of the first openings 241.

Herein, at least one of the second openings 161 is disposed in the light passing region R2. In addition, one of the second openings 161 and one of the optical sensing units 22 are overlapped in a top view. In addition, one of the first openings 241, one of the second openings 161 and one of the optical sensing units 22 are overlapped in a top view. Thus, the light (for example, photo signals input by a user) passing through the light passing region R2 can sequentially pass through one of the second openings 161 and one of the first openings 241 to reach one of the optical sensing units 22, as indicated by the dashed line with an arrow.

In the present embodiment, the second optical modulating layer 16 can comprise any light shielding material. For example, the second optical modulating layer 16 can be a metal layer, a light absorbing layer or any layer formed by opaque materials. In addition, the second openings 161 are aligned with the light passing region R2. Furthermore, the size of the second openings 161 is almost equal to the size of the light passing region R2. However, the present disclosure is not limited thereto.

When the electronic device is equipped with the second optical modulating layer 16, undesirable noise (for example, photo signals with large incident angles) can be filtered out.

Embodiment 3

Figure 6:
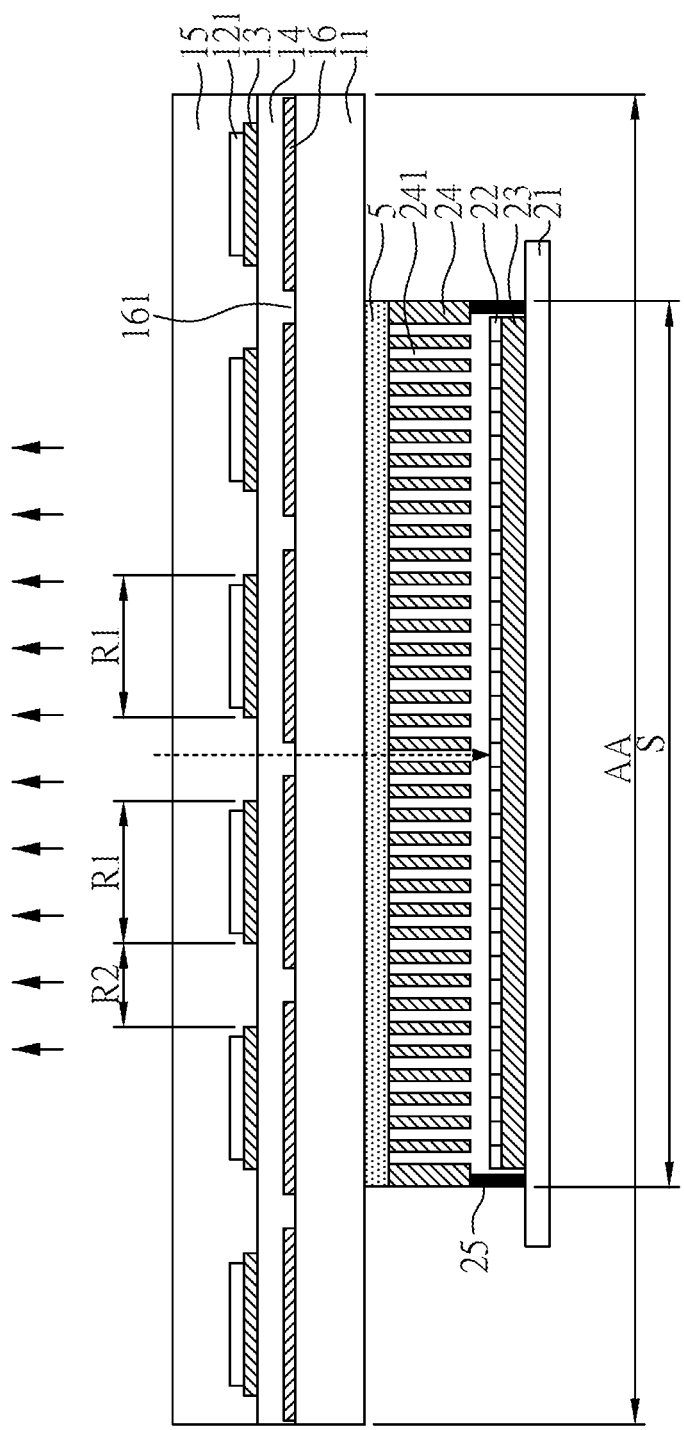
FIG. 6 is a cross sectional view showing a part of an electronic device according to Embodiment 3 of the present disclosure.

FIG. 6 is a cross sectional view showing a part of an electronic device according to the present embodiment. The electronic device of the present embodiment is similar to that of Embodiment 2, except for the following differences.

In the present embodiment, the size of the second openings 161 is less than the size of the light passing region R2, and the second openings 161 are still aligned with the light passing region R2. In addition, the sensing region S is less than the display region AA.

Embodiment 4

Figure 7:
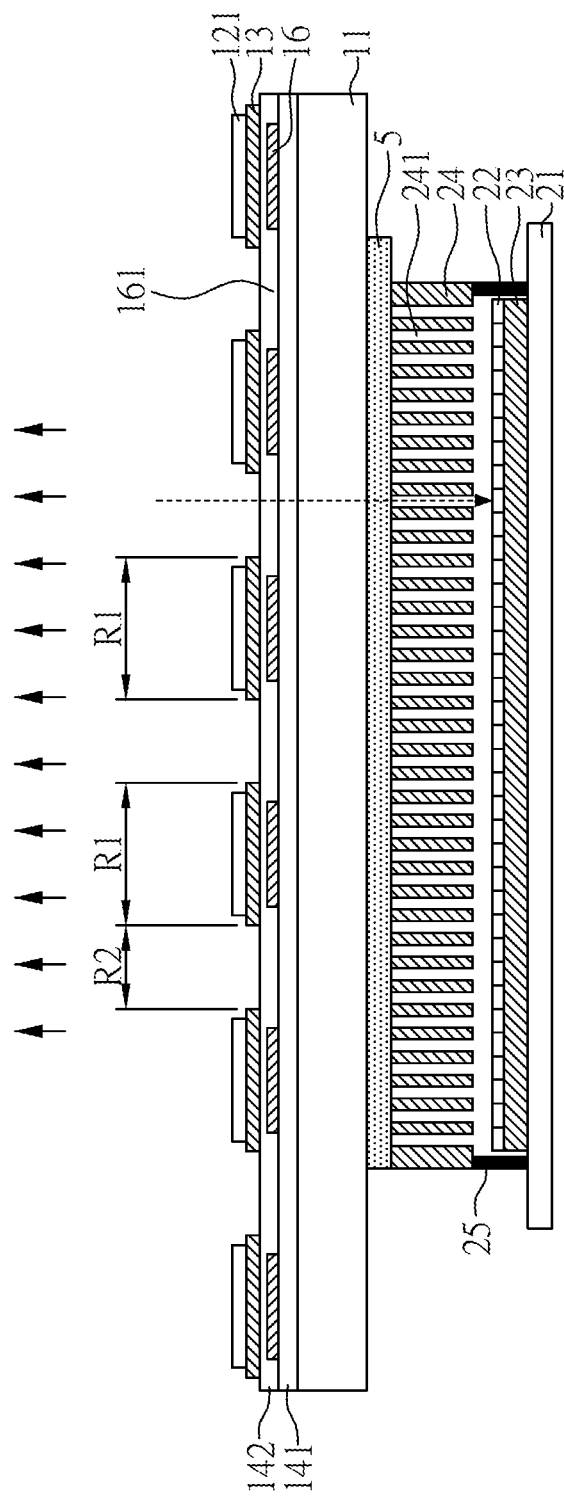
FIG. 7 is a cross sectional view showing a part of an electronic device according to Embodiment 4 of the present disclosure.

FIG. 7 is a cross sectional view showing a part of an electronic device according to the present embodiment. The electronic device of the present embodiment is similar to that of Embodiment 3, except for the following differences.

In the present embodiment, the size of the second openings 161 is greater than the size of the light passing region R2, and the second openings 161 are still aligned with the light passing region R2.

In addition, a first intermediate layer 141 is disposed on the substrate 11, the second optical modulating layer 16 is disposed on the first intermediate layer 141, a second intermediate layer 142 is disposed on the second optical modulating layer 16, and the driving layer 13 is disposed on the second intermediate layer 142. Herein, the first intermediate layer 141 and the second intermediate layer 142 may comprise a buffer layer, an insulating layer, a metal layer, a planarization layer or other layers for the display device. In other embodiments, the first intermediate layer 141 or the second intermediate layer 142 may be optional. However, the present disclosure is not limited thereto.

The second optical modulating layer 16 is disposed close to the substrate 11 in Embodiments 2 and 3. The second optical modulating layer 16 is disposed closer to the driving layer 13 in Embodiment 4, compared to that in Embodiments 2 and 3. Herein, the second optical modulating layer 16 can be formed in any step of the transistor preparation process. In one aspect, the second optical modulating layer 16 can be a metal layer firstly formed on the substrate 11. In another aspect, the second optical modulating layer 16 can be a metal layer together formed with a metal layer for forming a transistor. However, the present disclosure is not limited thereto.

In addition, the electronic device of the present embodiment does not comprise the encapsulating layer 15.

In the above Embodiments 2 to 4, the size of the second openings 161 and the size of the light passing region R2 are measured in a cross-sectional view of the electronic device. In other embodiment, the size of the second openings 161 and the size of the light passing region R2 can be measured by other manners.

Embodiment 5

Figure 8:
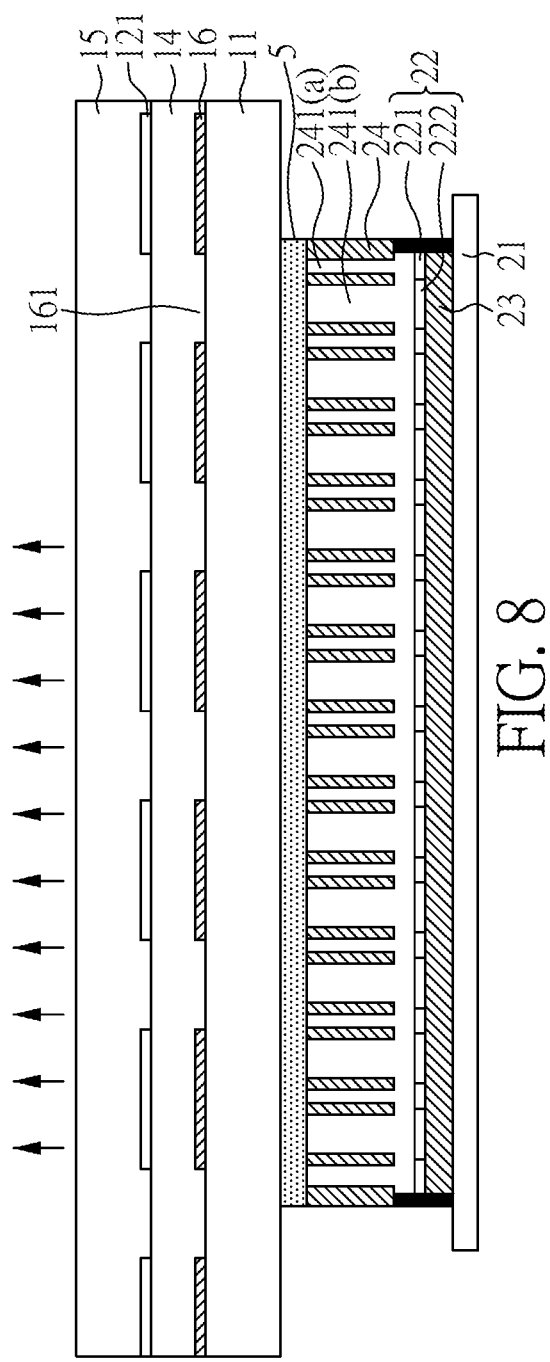
FIG. 8 is a cross sectional view showing a part of an electronic device according to Embodiment 5 of the present disclosure.

FIG. 8 is a cross sectional view showing a part of an electronic device according to the present embodiment, wherein the driving layer 13 is not shown. The electronic device of the present embodiment is similar to that of Embodiment 3, except for the following differences.

In the present embodiment, the optical sensing units 22 may have variety of the optical sensing units 22 with different size. For example, the optical sensing units 22 comprise at least one of first optical sensing unit 221 and at least one of second optical sensing unit 222, wherein a size of one of the first optical sensing unit 221 is less than a size of one of the second optical sensing unit 222. In this case, the sizes of the first openings 241 can also be varied according to the size of the optical sensing units 22. For example, a size of the first opening 241(*a*) corresponding to the one of the first optical sensing unit 221 is less than a size of the one of the first opening 241(*b*) corresponding to the second optical sensing unit 222.

Embodiment 6

Figure 9:
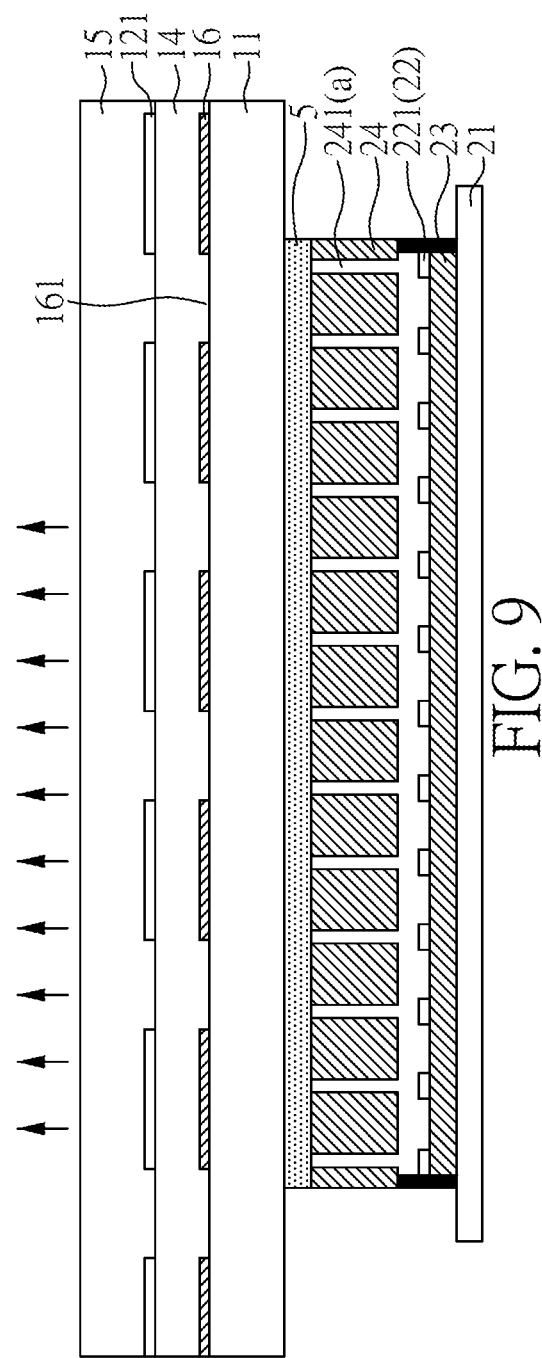
FIG. 9 is a cross sectional view showing a part of an electronic device according to Embodiment 6 of the present disclosure.

FIG. 9 is a cross sectional view showing a part of an electronic device according to the present embodiment, wherein the driving layer 13 is not shown. The electronic device of the present embodiment is similar to that of Embodiment 5, except for the following differences.

In the present embodiment, the optical sensing units 22 only comprises the first optical sensing unit 221, but does not comprise a second optical sensing unit 222 shown in FIG. 8. In addition, in the present embodiment, the first optical modulating layer 24 only comprises the first opening 241(*a*) corresponding to and being aligned with the first optical sensing unit 221.

Embodiment 7

FIG. 10 is a cross sectional view showing a part of an electronic device according to the present embodiment. The electronic device of the present embodiment is similar to that of Embodiment 2, except for the following differences.

In the electronic device of the present embodiment, the optical sensing module 2 comprises: a sensor driving layer 23 disposed on the substrate 11; and optical sensing units 22 disposed on the substrate 11 and adjacent to the sensor driving layer 23. Herein, the sensor driving layer 23 may comprise circuits, connecting wires, transistors or other components for driving optical sensing units 22. In the present embodiment, the optical sensing units 22 may be manufactured using processes usually used in manufacturing the thin film transistor (TFT) circuitry in display, e.g. the optical sensing units 22 may be manufactured on the substrate 11 using TFT processes before the display units 121 are manufactured.

Thus, in the electronic device of the present embodiment, the optical sensing module 2 is disposed between the substrate 11 and the display units 121.

In addition, the electronic device of the present embodiment does not comprise the first optical modulating layer 24, the first adhesive element 25 and the second adhesive element 5 shown in FIG. 4.

Other features of the electronic device of the present embodiment are similar to those of Embodiment 1, and are not repeated again.

Embodiment 8

FIG. 11 is a cross sectional view showing a part of an electronic device according to the present embodiment. The electronic device of the present embodiment is similar to that of Embodiment 7, except for the following differences.

In the electronic device of the present embodiment, the optical sensing module 2 comprises: a sensor driving layer 23 disposed under the substrate 11; and optical sensing units 22 disposed under the substrate 11 and adjacent to the sensor driving layer 23. Herein, the sensor driving layer 23 may comprise circuits, connecting wires, transistors or other components for driving optical sensing units 22.

Thus, in the electronic device of the present embodiment, the substrate 11 is disposed between the display units 121 and the optical sensing module 2.

In addition, the electronic device of the present embodiment comprises two sensing regions S, which are respectively less than the display region AA. In another embodiment of the present disclosure, the electronic device may comprise more than two sensing regions S.

Embodiment 9

Figure 12:
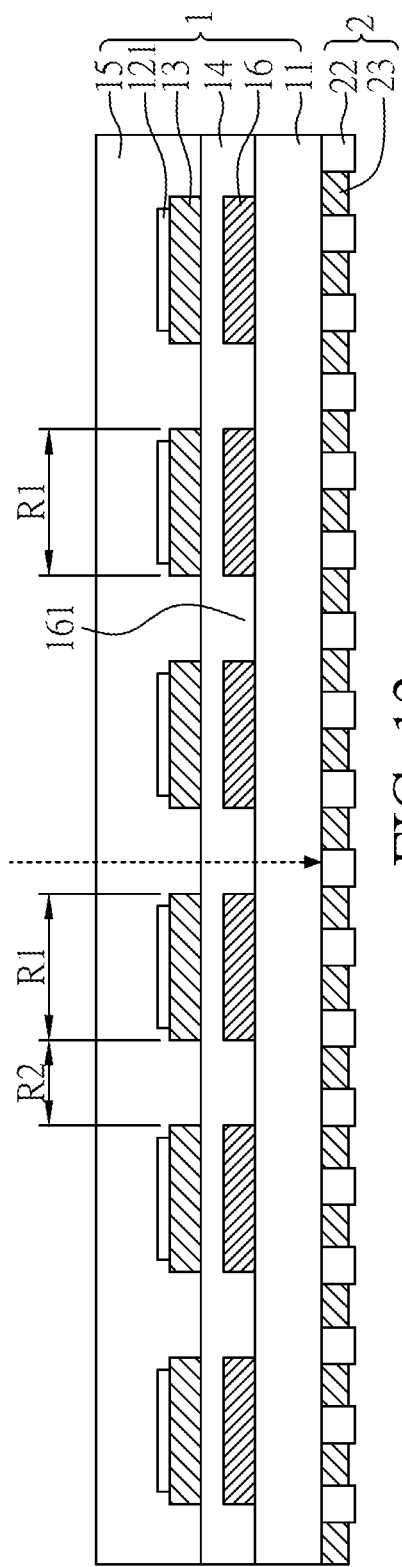
FIG. 12 is a cross sectional view showing a part of an electronic device according to Embodiment 9 of the present disclosure.

FIG. 12 is a cross sectional view showing a part of an electronic device according to the present embodiment. The electronic device of the present embodiment is similar to that of Embodiment 8, except for the following differences.

In the present embodiment, the electronic device further comprises: a second optical modulating layer 16 disposed between the substrate 11 and the plurality of display units 121, wherein the second optical modulating layer 16 comprises a plurality of second openings 161, and a density of the second openings 161 is less than density of the optical sensing units 22. The features of the second optical modulating layer 16 are similar to those stated above, and are not repeated again.

Thus, in the electronic device of the present embodiment, the light (for example, photo signals input by a user) passing through the light passing region R2 can pass through one of the second openings 161 to reach one of the optical sensing units 22, as indicated by the dashed line with the arrow.

In addition, the electronic device of the present embodiment comprises one sensing region S, which is almost equal to the display region AA.

Embodiment 10

Figure 13:
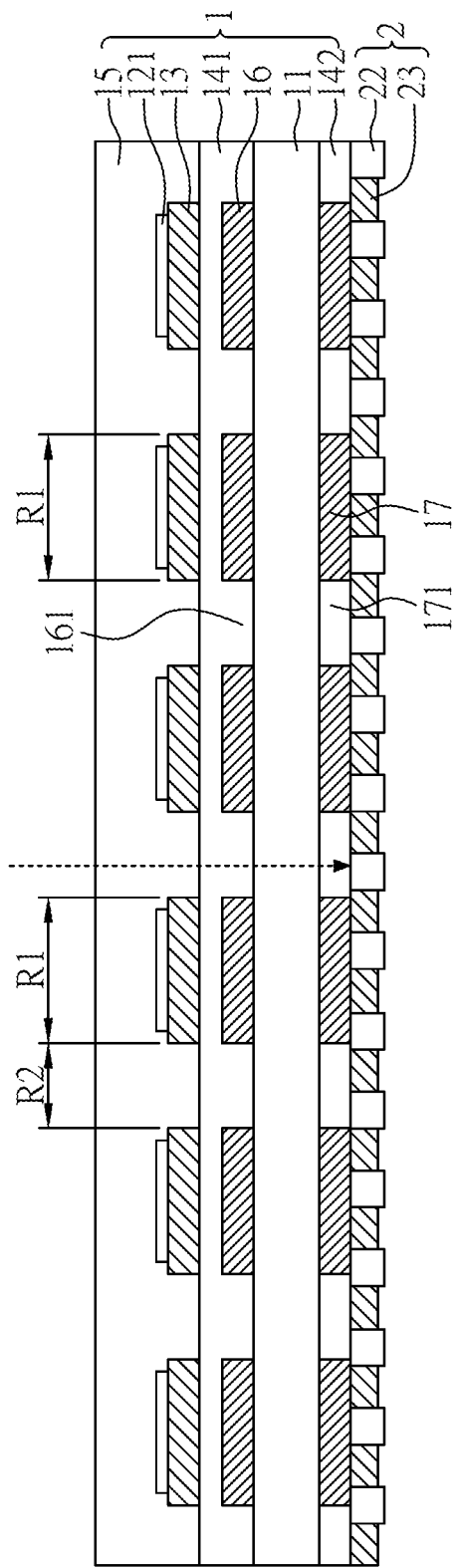
FIG. 13 is a cross sectional view showing a part of an electronic device according to Embodiment 10 of the present disclosure.

FIG. 13 is a cross sectional view showing a part of an electronic device according to the present embodiment. The electronic device of the present embodiment is similar to that of Embodiment 9, except for the following differences.

In the present embodiment, the electronic device further comprises: a third optical modulating layer 17 disposed between the substrate 11 and the optical sensing module 2, wherein the third optical modulating layer 17 comprises a plurality of third openings 171, and a density of the third openings 171 is less than density of the optical sensing units 22. The features of the third optical modulating layer 17 are similar to the features of the second optical modulating layer stated above, and are not repeated again.

Thus, in the electronic device of the present embodiment, the light (for example, photo signals input by a user) passing through the light passing region R2 can sequentially pass through one of the second openings 161 and one of the third openings 171 to reach one of the optical sensing units 22, as indicated by the dashed line with the arrow.

In the above Embodiments 1 to 6, the optical sensing module 2 is adhered onto the display module, as shown in FIG. 4 to FIG. 9. In the above Embodiments 7 to 10, the optical sensing module 2 is formed on the substrate 11 through a TFT process, as shown in FIG. 10 to FIG. 13. Thus, in the electronic device of Embodiments 7 to 10, the display units 121 and the optical sensing units 22 are formed through a TFT process.

In each embodiment of the present disclosure, the sensing region can greater than, equal to or less than the display region.

In the present disclosure, at least two electronic devices can be arranged in juxtaposition to form a tiled electronic device. The at least two electronic devices can be the same or different, which can be selected from the electronic device made as described in any of the embodiments of the present disclosure as described previously.

The electronic device made as described in any of the embodiments of the present disclosure as described previously could comprise a display panel, a touch display panel or a transparent display panel. Meanwhile, the display panel, the touch display panel or the transparent display panel may be applied to any electronic devices known in the art that need a display screen, such as displays, wearable electronic device, mobile phones, laptops, video cameras, still cameras, music players, mobile navigators, TV sets, household appliances, market appliances, public appliances, electrical equipment or other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. An electronic device, comprising:
a display module having a display side and comprising a plurality of display units; and
an optical sensing module disposed opposite to the display side and comprising a plurality of optical sensing units,
wherein a density of the plurality of optical sensing units is greater than a density of the plurality of display units;
wherein the display module has a light shielding region and a light passing region, the plurality of display units are disposed in the light shielding region, and at least one of the plurality of optical sensing units is disposed in the light passing region.

2. The electronic device of claim 1, further comprising a first optical modulating layer disposed between the display module and the optical sensing module, wherein the first optical modulating layer comprises a plurality of first openings, and a density of the plurality of first openings is greater than the density of the plurality of display units.

3. The electronic device of claim 2, wherein one of the plurality of first openings and one of the plurality of optical sensing units are overlapped in a top view.

4. The electronic device of claim 3, wherein a projection of the one of the plurality of first openings is within the one of the plurality of optical sensing units.

5. The electronic device of claim 2, wherein at least one of the plurality of first openings is disposed in the light passing region.

6. The electronic device of claim 2, further comprising a second optical modulating layer disposed between the plurality of display units and the first optical modulating layer.

7. The electronic device of claim 6, wherein the second optical modulating layer comprises a plurality of second openings, and a density of the plurality of second openings is less than the density of the plurality of first openings.

8. The electronic device of claim 7, wherein one of the plurality of second openings and one of the plurality of optical sensing units are overlapped in a top view.

9. The electronic device of claim 7, wherein one of the plurality of first openings, one of the plurality of second openings and one of the plurality of optical sensing units are overlapped in a top view.

10. The electronic device of claim 7, wherein at least one of the plurality of second openings is disposed in the light passing region.

11. The electronic device of claim 10, wherein a size of one of the plurality of second openings is less than a size of the light passing region.

12. The electronic device of claim 2, further comprising a first adhesive element disposed between the first optical modulating layer and the optical sensing module.

13. The electronic device of claim 12, further comprising a second adhesive element disposed between the display module and the first optical modulating layer.

14. The electronic device of claim 2, wherein one of the plurality of display units is overlapped with at least one of the plurality of first openings in a top view.

15. The electronic device of claim 1, wherein one of the plurality of display units is overlapped with at least one of the plurality of optical sensing units.

16. The electronic device of claim 1, further comprising a substrate, wherein the optical sensing module is disposed between the substrate and the plurality of display units.

17. The electronic device of claim 1, further comprising a substrate, wherein the substrate is disposed between the plurality of display units and the optical sensing module.

18. The electronic device of claim 17, further comprising a second optical modulating layer disposed between the substrate and the plurality of display units, wherein the second optical modulating layer comprises a plurality of second openings, and a density of the plurality of second openings is less than density of the plurality of optical sensing units.

19. The electronic device of claim 18, further comprising a third optical modulating layer disposed between the substrate and the optical sensing module, wherein the third optical modulating layer comprises a plurality of third openings, and a density of the plurality of third openings is less than density of the plurality of optical sensing units.

* * * * *